United States Patent
Oh et al.

(10) Patent No.: US 8,745,452 B2
(45) Date of Patent: Jun. 3, 2014

(54) RESISTIVE MEMORY DEVICE AND TEST SYSTEMS AND METHODS FOR TESTING THE SAME

(75) Inventors: Hyung Rok Oh, Yongin-si (KR); Chul Woo Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 13/587,100

(22) Filed: Aug. 16, 2012

(65) Prior Publication Data

US 2013/0051124 A1 Feb. 28, 2013

(30) Foreign Application Priority Data

Aug. 23, 2011 (KR) ........................ 10-2011-0084190

(51) Int. Cl.
| | |
|---|---|
| G11C 29/00 | (2006.01) |
| G11C 13/00 | (2006.01) |
| G11C 29/50 | (2006.01) |
| G11C 29/48 | (2006.01) |
| G11C 29/56 | (2006.01) |

(52) U.S. Cl.
CPC ............ *G11C 13/0002* (2013.01); *G11C 29/50* (2013.01); *G11C 29/48* (2013.01); *G11C 29/56* (2013.01)
USPC .......................................... 714/718; 365/148

(58) Field of Classification Search
CPC .... G11C 13/0002; G11C 29/50; G11C 29/48; G11C 29/56
See application file for complete search history.

(56) References Cited

U.S. PATENT DOCUMENTS

| | | | | |
|---|---|---|---|---|
| 6,950,334 | B2 * | 9/2005 | Shimizu et al. | 365/158 |
| 6,996,020 | B2 * | 2/2006 | Yoshida | 365/210.1 |
| 7,167,389 | B2 * | 1/2007 | Iwata | 365/158 |
| 2002/0191437 | A1 * | 12/2002 | Yamada | 365/158 |
| 2004/0042279 | A1 * | 3/2004 | Oumiya et al. | 365/200 |
| 2004/0088471 | A1 | 5/2004 | Perner et al. | |
| 2004/0165419 | A1 * | 8/2004 | Tsuji | 365/158 |
| 2007/0147146 | A1 * | 6/2007 | Yamada et al. | 365/200 |
| 2007/0171698 | A1 | 7/2007 | Hoenigschmid et al. | |
| 2008/0056041 | A1 * | 3/2008 | Liaw et al. | 365/208 |
| 2008/0112208 | A1 * | 5/2008 | Cho et al. | 365/148 |
| 2009/0067216 | A1 * | 3/2009 | Kim et al. | 365/148 |
| 2010/0165693 | A1 * | 7/2010 | Ohgami | 365/51 |

FOREIGN PATENT DOCUMENTS

| | | |
|---|---|---|
| JP | 2010-086638 | 4/2010 |
| KR | 1020020012165 A | 2/2002 |

* cited by examiner

*Primary Examiner* — John Trimmings
(74) *Attorney, Agent, or Firm* — Myers Bigel Sibley & Sajovec, PA

(57) ABSTRACT

A resistive memory device and a system and method for testing the resistive memory device are provided. The resistive memory device includes a plurality of bit lines comprising at least one dummy bit line to which a plurality of resistive memory cells are connected, a conducting wire connected to the dummy bit line, a first switching element positioned between the dummy bit line and an external device outside the resistive memory device, and a second switching element positioned between the conducting wire and the external device. Accordingly, the operational reliability of the resistive memory device may be increased.

17 Claims, 11 Drawing Sheets

FIG. 4

| | FIRST SWITCHING ELEMENT | SECOND SWITCHING ELEMENT | Read |
|---|---|---|---|
| Default | off | off | × |
| Path1 'on' | on | off | $\Delta V = (R_{1T1R} + R_{path1}) * i_1$ |
| Path2 'on' | off | on | $\Delta V = (R_{1T1R} + R_{path2}) * i_2$ |
| Both 'on' | on | on | $\Delta V = (\frac{R_{path1} \cdot R_{path2}}{R_{path1} + R_{path2}} + R_{1T1R}) * i_3$ |

# RESISTIVE MEMORY DEVICE AND TEST SYSTEMS AND METHODS FOR TESTING THE SAME

CROSS-REFERENCE TO RELATED APPLICATIONS

This application claims priority under 35 U.S.C. §119(a) from Korean Patent Application No. 10-2011-0084190 filed on Aug. 23, 2011, the disclosure of which is hereby incorporated by reference in its entirety.

BACKGROUND

Resistive memory is nonvolatile memory and is characterized by that it has a data processing rate of volatile memory and retains the stored data even when not powered.

For instance, when voltage and current are supplied to phase-change random access memory (PRAM) in which a phase-change layer is inserted between a top electrode and a bottom electrode, heat is retained in the phase-change layer, which changes electrical conduction state according to the change in resistance. AgInSbTe is a material that is usually used for the phase-change layer. The phase-change layer is usually formed using a compound having a chalcogen element (e.g., S, Se or Te) as a main component, and more particularly, using an alloy (e.g., Ge2Sb2Te5) of germanium (Ge), antimony (Sb) and tellurium (Te).

The PRAM includes a phase-change resistor. When a current lower than a threshold value flows in the phase-change resistor, the phase-change layer reaches an appropriate temperature at which the phase-change layer is crystallized. Accordingly, the phase-change layer transforms into a crystalline state, i.e., a low resistance state.

In contrast, when a current higher than the threshold value flows in the phase-change resistor, the phase-change layer transforms into an amorphous state. In other words, data can be stored in a nonvolatile manner by using the resistance state which changes with the magnitude of current.

Meanwhile, a cell array of the resistive memory device includes a unit cell at each of intersections between a plurality of bit lines and a plurality of word lines. The unit cell can be represented with a resistor and a diode in a circuit. The current flowing in the resistive memory device may vary with processes or a path through which the current reaches each cell. As the current has a variation, a resistance value changes and a read operation and a write operation can be performed distinguishably. Accordingly, it may be desirable that there is a big difference between the highest resistance value and the lowest resistance value. It may be required to calculate a resistance value of a bit line in order to recognize how much current is required with respect to the distribution of cells to enable the read operation on a cell to be clearly distinguished from the write operation on the cell.

SUMMARY

According to some embodiments of the inventive concept, there is provided a memory device that includes a memory cell array that includes a plurality of resistive memory cells, a plurality of bit lines connected to the plurality of resistive memory cells, the plurality of bit lines including at least one dummy bit line, a conductive wire that is connected to the at least one dummy bit line and a switch unit that includes a first switching element that is configured to connect the dummy bit line to an external device that is outside the resistive memory device. In some embodiments, the switch unit further includes a second switching element that is configured to connect the conducting wire to the external device.

Some embodiments include control logic that is configured to control an on/off operation of at least one of the first switching element and the second switching element. In some embodiments, the control logic controls the first switching element to connect the external device with the dummy bit line and controls the second switching element to connect the external device with the conducting wire.

In some embodiments, ones of the resistive memory cells include a memory element and at least one of a diode or a select element.

Some embodiments of the present inventive concept include a test system that includes a memory device as disclosed herein, a connection pad configured to connect the memory device with the external device, and a tester configured to adjust current flowing in each of the resistive memory cells, the dummy bit line and the conducting wire and adjust voltage applied to each resistive memory cell, the dummy bit line and the conducting wire through the connection pad.

In some embodiments, the tester controls the control logic to turn on the first switching element and obtains a relation between a resistance value of the resistive memory cell and a resistance value of the dummy bit line when the first switching element is turned on. Some embodiments provide that the tester controls the control logic to turn on the second switching element and obtains a relation between a resistance value of the resistive memory cell and a resistance value of the conducting wire when the second switching element is turned on. In some embodiments, the tester controls the control logic to turn on the first and second switching elements and obtains a relation among a resistance value of the resistive memory cell, a resistance value of the dummy bit line and a resistance value of the conducting wire when the first and second switching element are turned on. Some embodiments provide that the tester calculates the resistance values of the dummy bit line, the conducting wire and the resistive memory cell based on a current flowing in the resistive memory cell, the dummy bit line and the conducting wire according to the applied voltage.

Some embodiments of the present inventive concept include a resistive memory system that includes a memory device as disclosed herein, and a processor configured to control an operation of the memory device.

Some embodiments of the present inventive concept, include methods of testing a memory device. Such methods may include applying a predetermined voltage to at least one dummy bit line among a plurality of bit lines and a resistive memory cell, storing a relation between a resistance value of the resistive memory cell and a resistance value of the dummy bit line, applying the predetermined voltage to a conducting wire connected to the dummy bit line and the resistive memory cell, and storing a relation between the resistance value of the resistive memory cell and a resistance value of the conducting wire. Methods may further include applying the predetermined voltage to the dummy bit line, the conducting wire and the resistive memory cell, storing a relation among the resistance values of the dummy bit line, the conducting wire and the resistive memory cell, and calculating the resistance values of the resistive memory cell, the dummy bit line and the conducting wire based on the stored relations.

In some embodiments, the predetermined voltage is applied by an external device outside the resistive memory device that includes the dummy bit line and the resistive memory cell connected to the dummy bit line.

Some embodiments provide that storing the relation between the resistance value of the resistive memory cell and the resistance value of the dummy bit line comprises storing the relation formed based on a first current value that flows in the dummy bit line and the resistive memory cell according to the predetermined voltage and the predetermined voltage.

In some embodiments, storing the relation between the resistance value of the resistive memory cell and the resistance value of the conducting wire comprises storing the relation formed based on a second current value which flows in the conducting wire and the resistive memory cell according to the predetermined voltage and the predetermined voltage.

Some embodiments provide that storing the relation among the resistance values of the dummy bit line, the conducting wire and the resistive memory cell comprises storing the relation formed based on a third current value which flows in the dummy bit line, the conducting wire and the resistive memory cell according to the predetermined voltage and the predetermined voltage.

In some embodiments, the relation between the resistance value of the resistive memory cell and the resistance value of the dummy bit line is $\Delta V = (R_{1T1R} + R_{path1}) \times i_1$, the relation between the resistance values of the resistive memory cell and the conducting wire is $\Delta V = (R_{1T1R} + R_{path2}) \times i_2$, and the relation among the resistance values of the resistive memory cell, the conducting wire and the dummy bit line is $\Delta V = (R_{1T1R} + (R_{path1} \times R_{path2})/(R_{path1} + R_{path2})) \times i_3$, where $\Delta V$, $i_1$, $i_2$ and $i_3$ respectively denote the predetermined voltage, the first current value, the second current value and the third current value, $R_{1T1R}$ denotes the resistance value of the resistive memory cell, $R_{path1}$ denotes the resistance value of the dummy bit line, and $R_{path2}$ denotes the resistance value of the conducting wire.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIG. 4 is a table showing the relationship between resistance values with respect to the operations of a switch unit according to some embodiments of the inventive concept.

DETAILED DESCRIPTION OF THE EMBODIMENTS

Figure 1:
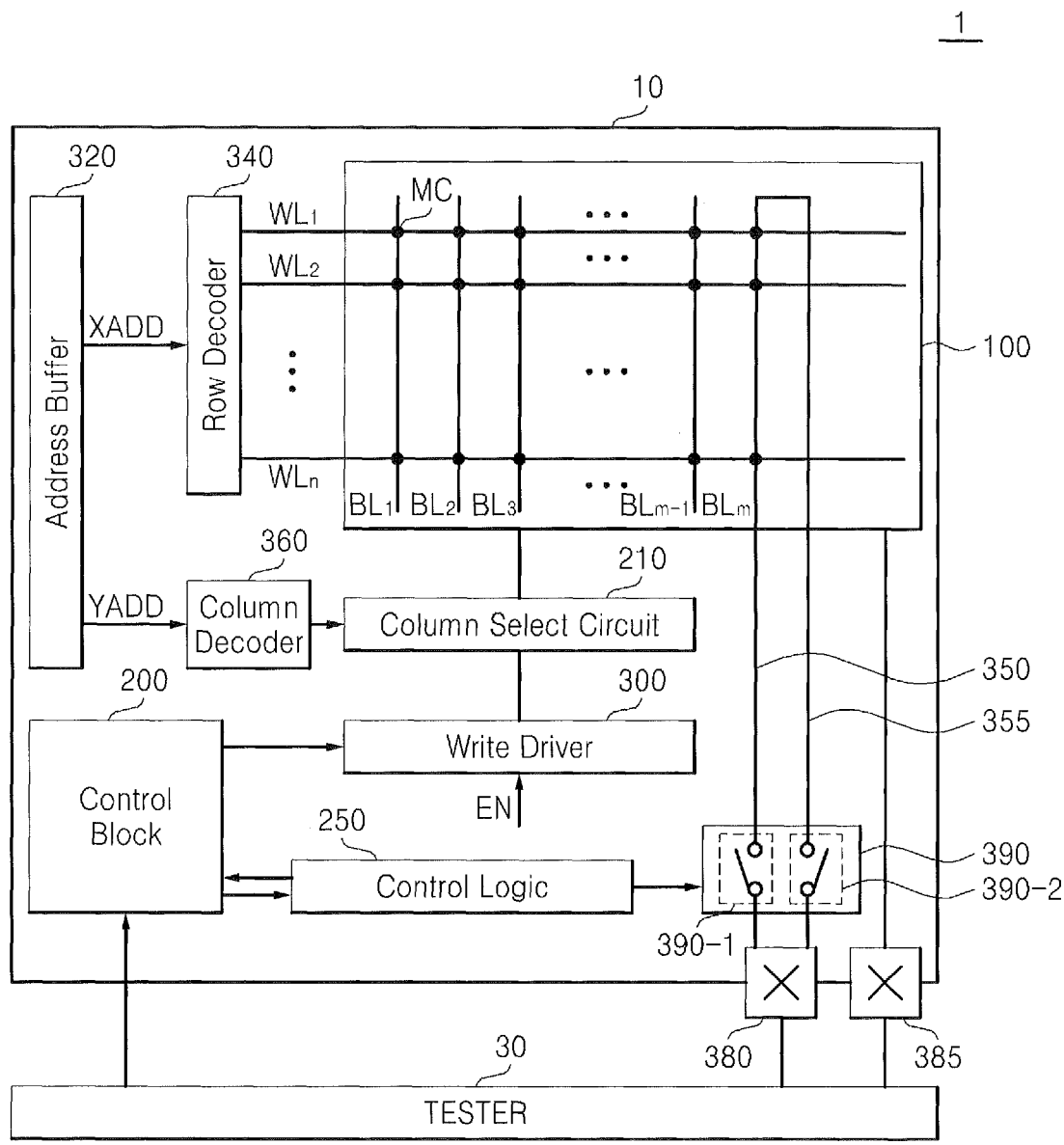
FIG. 1 is a block diagram of a test system including a resistive memory device and a tester to test the resistive memory device according to some embodiments of the inventive concept.

The inventive concept now will be described more fully hereinafter with reference to the accompanying drawings, in which embodiments of the invention are shown, This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a test system 1 including a resistive memory device 10 and a tester 30 to test the resistive memory device 10 according to some embodiments of the inventive concept.

The test system 1 includes the resistive memory device 10, the tester 30 and connection pads 380 and 385.

The resistive memory device 10 includes a memory cell array 100, a control block 200, a column select circuit 210, a write driver 300, an address buffer 320, a row decoder 340, a column decoder 360, a control logic 250 and a switch unit 390.

The memory cell array 100 includes a plurality of bit lines $BL_1$ through $BL_m$, a plurality of word lines $WL_1$ through $WL_n$, a conducting wire 355 and a plurality of resistive memory cells MC.

The bit lines $BL_1$ through $BL_m$ include at least one dummy bit line 350. The dummy bit line 350 illustrated in FIG. 1 is the bit line $BL_m$ among the bit lines $BL_1$ through $BL_m$. In other words, the resistance values of the bit lines $BL_1$ through $BL_m$ can be measured using the one dummy bit line 350 among the existing bit lines $BL_1$ through $BL_m$ without a special dummy bit line separately provided.

The conducting wire 355 may be disposed in parallel with the dummy bit line 350. The dummy bit line 350 may be connected with the conducting wire 355. The dummy bit line 350 may be a bit line positioned at the center or on the periphery of the memory cell array 100 among the bit lines $BL_1$ through $BL_m$. Since the dummy bit line 350 is one of the bit lines $BL_1$ through $BL_m$, a plurality of resistive memory cells MC are connected to the dummy bit line 350.

The dummy bit line 350 and the conducting wire 355 are connected with an external device outside the resistive memory device 10. The dummy bit line 350 and the conducting wire 355 may be connected to the external device by a first switching element 390-1 and a second switching element 390-2, respectively.

The conducting wire 355 is not connected with the resistive memory cells MC and may be connected with only the dummy bit line 350 in the memory cell array 100.

A predetermined voltage may be applied to the conducting wire 355 and the dummy bit line 350 through the tester 30 positioned outside the resistive memory device 10. The voltage may be applied via the connection pads 380 and 385 which connect the resistive memory device 10 to the tester 30. The voltage applied via the connection pads 380 and 385 has a direct current (DC) level. The connection pad 380 may connect the resistive memory device 10 to the tester 30 through the switch unit 390. The connection pad 380 may be included in the resistive memory device 10. The connection pad 385 is connected to a source of a transistor included in each resistive memory cell MC in the memory cell array 100. The voltage applied via the connection pad 385 may be a common voltage to the source of the transistor of each resistive memory cell MC.

The connection pad 385 may be positioned between the resistive memory cells MC and the tester 30 so that an external voltage is applied to the resistive memory cells MC.

The dummy bit line 350 and the conducting wire 355 have a dummy bit line resistance and a conducting wire resistance, respectively.

Each of the resistive memory cells MC may be a memory cell, which can store data using a phase-change material such as Ge—Sb—Te (GST). Each resistive memory cell MC includes a memory element and a select element. The phase-change material has one of two stable states, i.e., a crystalline state and an amorphous state, according to temperature. In other words, the resistive memory cells MC may be phase-change memory cells.

Accordingly, the resistance of the resistive memory cells MC in the resistive memory device 10 has a variation. In order to obtain the variation in the resistance of the resistive memory cells MC, a reference value may be set in advance through the dummy bit line 350.

When a current that produces high resistance is referred to as a reset current, the reset current also has a variation. This is because a physical contact has a difference among the resistive memory cells MC and because of differences in distances between memory cells MC close to the write driver 300 and memory cells MC far from the write driver 300. It may be necessary to know a resistance value of each resistive memory cell MC and a resistance value of each of the bit lines $BL_1$ through $BL_m$ in order to adjust the variations. The resistance value of each of the bit lines $BL_1$ through $BL_m$ may be obtained by calculating a resistance value of the dummy bit line 350.

The control block 200 may control the operations of the write driver 300, the address buffer 320, the row decoder 340 and the column decoder 360. In other words, the control block 200 may control the overall operation of the resistive memory device 10.

In addition, the control block 200 generates and outputs a program pulse and a bias voltage to the write driver 300. The program pulse includes a set pulse and a reset pulse and the bias voltage includes a set bias voltage and a reset bias voltage.

The control block 200 may also adjust the program current of a semiconductor chip based on a trimming value.

The trimming value includes information about the level or amplitude of a bias voltage in a normal operation. Even though semiconductor chips may be manufactured using the same processes, they may not have the same electrical characteristics. As a result, even if bias voltages having the same level are respectively applied to the semiconductor chips, program currents of the respective semiconductor chips may have different levels. Accordingly, information about a bias voltage allowing each semiconductor chip to present the optimum performance may be stored as the trimming value. The semiconductor chips may have different trimming values.

The column select circuit 210 controls the connection between the memory cell array 100 and the write driver 300 in response to at least one select signal output from the column decoder 360. In other embodiments, the column select circuit 210 may be included in the column decoder 360.

The column select circuit 210 may include a plurality of select switches each of which controls the connection between the write driver 300 and one of the bit lines $BL_1$ through $BL_m$ in response to one of a plurality of select signals output from the column decoder 360.

The write driver 300 may provide a program current (a set current or a reset current) to the bit lines $BL_1$ through $BL_m$ in response to the program pulse, the bias voltage and an enable signal EN. In detail, the write driver 300 may provide the set current to the bit lines $BL_1$ through $BL_m$ in response to the set pulse, the set bias voltage and the enable signal EN and may provide the reset current to the bit lines $BL_1$ through $BL_m$ in response to the reset pulse, the reset bias voltage and the enable signal EN. The enable signal EN is a signal for enabling the write driver 300.

The row decoder 340 may decode a row address XADD output from the address buffer 320 and apply a word line driving voltage to at least one word line among the word lines $WL_1$ through $WL_n$ according to the decoding result. In other words, the row decoder 340 may select the at least one word line among the word lines $WL_1$ through $WL_n$ in response to the row address XADD.

The column decoder 360 may decode a column address YADD output from the address buffer 320 and generate the at least one select signal for selecting at least one bit line among the bit lines $BL_1$ through $BL_m$ according to the decoding result.

The control logic 250 may be controlled by the tester 30 provided outside the resistive memory device 10 and may control the on/off function of the switch unit 390. The control logic 250 may be implemented separately from the control block 200 and may be included in the control block 200.

The switch unit 390 may include the first switching element 390-1 that connects the dummy bit line 350 to an external device outside the resistive memory device 10 and the second switching element 390-2 that connects the conducting wire 355 to the external device outside the resistive memory device 10.

The structure of the switch unit 390 is not restricted to the drawings and may include any switching element that can perform on/off control.

The tester 30 is provided outside the resistive memory device 10 and may control a voltage applied to the resistive memory cells MC, the dummy bit line 350 and the conducting wire 355 through the connection pad 380. The tester 30 may also control a current flowing in the resistive memory cells MC, the dummy bit line 350 and the conducting wire 355 through the connection pad 380 based on the applied voltage. The magnitude of the current may be determined depending on current driving capability in accordance with the channel properties of a probe card. In other words, the tester 30 may measure the applied voltage and the current.

The tester 30 may control the on/off function of the first switching element 390-1 and/or the second switching element 390-2 by controlling the control logic 250. Since the tester 30 is provided outside the resistive memory device 10, it may be connected with the control logic 250 in the resistive memory device 10 through the connection pad 385 according to some embodiments of the inventive concept.

When the tester 30 controls the control logic 250 to turn on the first switching element 390-1, it may set the relation between a resistance value of each of the resistive memory cells MC and a resistance value of the dummy bit line 350. When the first switching element 390-1 is turned on, the tester 30 may set the relation between the resistance value of each resistive memory cell MC and the resistance value of the dummy bit line 350 using the Ohm's law based on external current and voltage provided through the first switching element 390-1. In other words, the tester 30 may obtain as a result value a mathematical formula having the resistance values of the dummy bit line 350 and the resistive memory cell MC as variables. The result value may be stored in the tester 30.

When the tester 30 controls the control logic 250 to turn on the second switching element 390-2, it may set the relation between the resistance value of each of the resistive memory cells MC and a resistance value of the conducting wire 355. When the second switching element 390-2 is turned on, the tester 30 may set the relation between the resistance value of each resistive memory cell MC and the resistance value of the conducting wire 355 using the Ohm's law based on external current and voltage provided through the second switching element 390-2. In other words, the tester 30 may obtain as a result value a mathematical formula having the resistance values of the conducting wire 355 and the resistive memory cell MC as variables. The result value may be stored in the tester 30.

When the control logic 250 is controlled by the tester 30 to turn on the first and second switching elements 390-1 and 390-2, the tester 30 may set the relation among the resistance value of each resistive memory cell MC, the resistance value of the dummy bit line 350 and the resistance value of the conducting wire 355. When the first and second switching elements 390-1 and 390-2 are turned on, the tester 30 may set the relation among the resistance values of the resistive memory cell MC, the dummy bit line 350 and the conducting wire 355 using the Ohm's law based on external current and voltage provided through the first and second switching elements 390-1 and 390-2. In other words, the tester 30 may obtain as a result value a mathematical formula having the resistance values of the dummy bit line 350, the conducting wire 355 and the resistive memory cell MC as variables. The result value may be stored in the tester 30. At this time, resistance of the dummy bit line 350 and resistance of the conducting wire 355 may be connected in parallel to each other. The connection will be described in detail with reference to FIGS. 3 and 4 later.

The connection pad 380 may connect an external device outside the resistive memory device 10 with the resistive memory device 10. The connection pad 380 may connect the tester 30 outside the resistive memory device 10 with the memory cell array 100 inside the resistive memory device 10. The bit lines $BL_1$ through $BL_{m-1}$ included in the memory cell array 100 are connected to the write driver 300. However, the dummy bit line 350 may not be connected to the write driver 300 but may be directly connected to the tester 30 outside the resistive memory device 10 through the connection pad 380.

Figure 2:
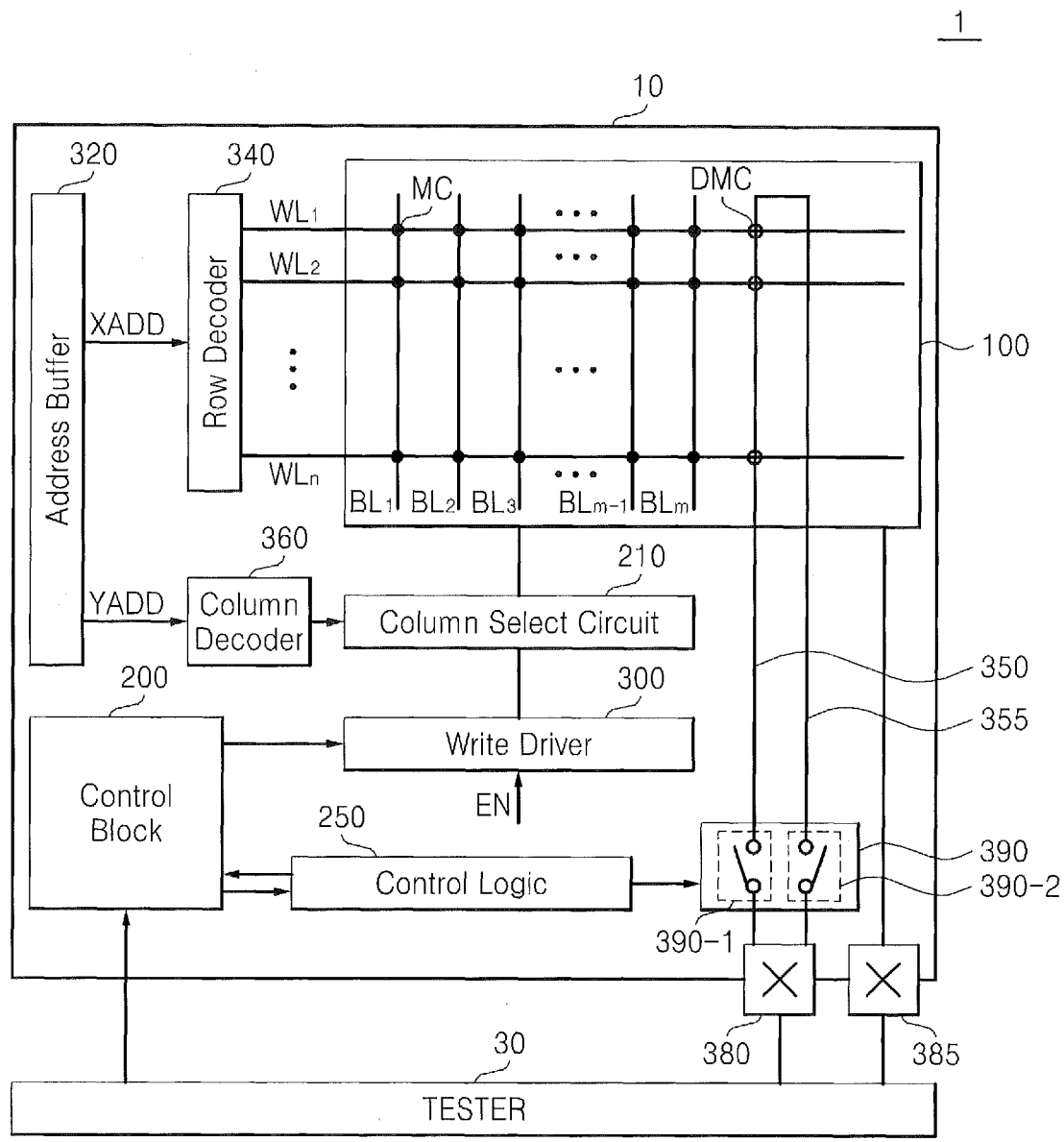
FIG. 2 is a block diagram of a test system including a resistive memory device and a tester to test the resistive memory device according to other embodiments of the inventive concept.

FIG. 2 is a block diagram of a test system 1 including a resistive memory device 10 and a tester 30 to test the resistive memory device 10 according to other embodiments of the inventive concept.

Referring to FIG. 2, the test system 1 includes the resistive memory device 10, the tester 30 and connection pads 380 and 385.

The resistive memory device 10 includes a memory cell array 100, a control block 200, a column select circuit 210, a write driver 300, an address buffer 320, a row decoder 340, a column decoder 360, a control logic 250 and a switch unit 390.

The memory cell array 100 includes at least one dummy bit line 350, a plurality of bit lines $BL_1$ through $BL_m$, a plurality of word lines $WL_1$ through $WL_n$, a conducting wire 355 and a plurality of resistive memory cells MC.

The dummy bit line 350 that has the same characteristics as the bit lines $BL_1$ through $BL_m$ is separately provided in the memory cell array 100. The conducting wire 355 may be disposed in parallel with the dummy bit line 350. The dummy bit line 350 may be connected with the conducting wire 355. The dummy bit line 350 may be positioned at the center or on the periphery of the memory cell array 100. A plurality of resistive dummy memory cells DMC are connected to the dummy bit line 350.

The dummy bit line 350 and the conducting wire 355 are connected with an external device outside the resistive memory device 10. The dummy bit line 350 and the conducting wire 355 may be connected to the external device by a first switching element 390-1 and a second switching element 390-2, respectively.

The conducting wire 355 is not connected with the resistive dummy memory cells DMC and may be connected with only the dummy bit line 350 in the memory cell array 100.

A predetermined voltage may be applied to the conducting wire 355 and the dummy bit line 350 through the tester 30 positioned outside the resistive memory device 10. The voltage may be applied via the connection pads 380 and 385, which connect the resistive memory device 10 to the tester 30.

The voltage applied via the connection pads 380 and 385 has a DC level. The connection pad 380 may connect the resistive memory device 10 to the tester 30 through the switch unit 390. The connection pad 380 may be included in the resistive memory device 10. The connection pad 385 is connected to a source of a transistor included in each dummy resistive memory cell DMC in the memory cell array 100. The voltage applied via the connection pad 385 may be a common voltage to the source of the transistor of each resistive memory cell MC.

The connection pad 385 may be positioned between the resistive memory cells MC and the tester 30 so that an external voltage is applied to the resistive memory cells MC.

The dummy bit line 350 and the conducting wire 355 have a dummy bit line resistance and a conducting wire resistance, respectively.

Each of the resistive dummy memory cells DMC may be a memory cell that can store data using a phase-change material such as GST(Ge—Sb—Te). Each resistive dummy memory cell DMC includes a memory element and a select element. The phase-change material has one of two stable states, i.e., a crystalline state and an amorphous state, according to temperature. In other words, the resistive dummy memory cells DMC may be phase-change memory cells.

Each of the resistive dummy memory cells DMC includes a resistor having a terminal connected to the dummy bit line 350 and a transistor having a gate and a source that are connected to a ground voltage and a drain, which is connected to another terminal of the resistor. The structure of the resistive dummy memory cells DMC is fundamentally the same as that of the resistive memory cells MC, with the exception that the gate of the transistor included in each resistive dummy memory cell DMC is connected to the ground voltage and is always in a turn-off state.

The resistance of the resistive dummy memory cells DMC in the resistive memory device 10 has a variation like the resistive memory cells MC. In order to obtain the variation in the resistance of the resistive dummy memory cells DMC, a reference value may be set in advance through the dummy bit line 350.

When a current that produces high resistance is referred to as a reset current, the reset current also has a variation. This is because a physical contact has a difference among the resistive memory cells MC and because of differences in distances between memory cells MC close to the write driver 300 and memory cells MC far from the write driver 300. It may be necessary to know a resistance value of each resistive memory cell MC and a resistance value of each of the bit lines $BL_1$ through $BL_m$ in order to adjust the variations. The resistance value of the resistive memory cell MC and the resistance value of each of the bit lines $BL_1$ through $BL_m$ may be obtained by calculating a resistance value of the dummy bit line 350.

Figure 3:
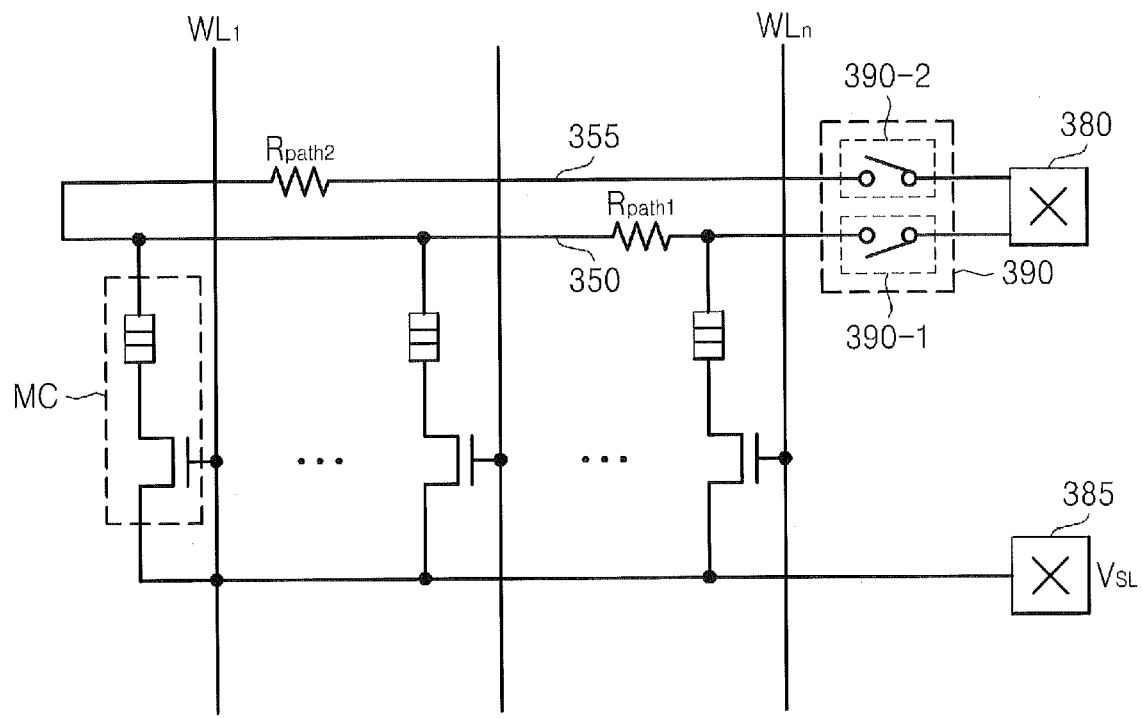
FIG. 3 is a schematic circuit diagram of a dummy bit line and a memory cell array according to some embodiments of the inventive concept.

FIG. 3 is a schematic circuit diagram of the dummy bit line 350 and a memory cell array according to some embodiments of the inventive concept.

Referring to FIGS. 1 through 3, the resistive memory cells MC illustrated in FIG. 3 are connected to the dummy bit line 350 and the word lines $WL_1$ through $WL_n$. The dummy bit line 350 has a resistance value $R_{path1}$ and the conducting wire 355 has a resistance value $R_{path2}$. The dummy bit line 350 and the conducting wire 355 are connected to the connection pad 380 through the switch unit 390.

Each of the resistive memory cells MC is connected to the connection pad 385 connecting the resistive memory device 10 to an external device and a predetermined voltage is applied through the connection pad 385. Meanwhile, the tester 30 may also apply a predetermined voltage through the connection pad 380. According to the voltage applied by the tester 30, a predetermined current may flow in the dummy bit line 350, the resistive memory cells MC and the conducting wire 355.

When one of the resistive memory cells MC is selected, a path is set through the selected cell MC. When the first switching element 390-1 is turned on and the second switching element 390-2 is turned off, the voltage applied through the connection pad 380 is put across the resistance of the dummy bit line 350 and the resistance of the selected resistive memory cell MC.

At this time, the tester 30 may set the relation between the resistance value of the dummy bit line 350 and the resistance value of the resistive memory cell MC through a specific loop formed by selecting the resistive memory cell MC. In other words, a mathematical formula having the resistance values of the dummy bit line 350 and the resistive memory cell MC as variables may be obtained as a result value. The result value may be stored in the tester 30.

When the first switching element 390-1 is turned off and the second switching element 390-2 is turned on, the voltage applied through the connection pad 380 is put across the resistance of the conducting wire 355 and the resistance of the selected resistive memory cell MC.

At this time, the tester 30 may set the relation between the resistance value of the conducting wire 355 and the resistance value of the resistive memory cell MC through the specific loop formed by selecting the resistive memory cell MC. In other words, a mathematical formula having the resistance values of the conducting wire 355 and the resistive memory cell MC as variables may be obtained as a result value. The result value may be stored in the tester 30.

When both of the first and the second switching elements 390-1 and 390-2 are turned on, the voltage applied by the tester 30 through the connection pad 380 is put across the resistance of the dummy bit line 350, the resistance of the conducting wire 355 and the resistance of the selected resistive memory cell MC.

At this time, the tester 30 may set the relation among the resistance values of the dummy bit line 350, the conducting wire 355 and the resistive memory cell MC through the specific loop formed by selecting the resistive memory cell MC. In other words, a mathematical formula having the resistance values of the dummy bit line 350, the conducting wire 355 and the resistive memory cell MC as variables may be obtained as a result value. The result value may be stored in the tester 30.

Figure 5:
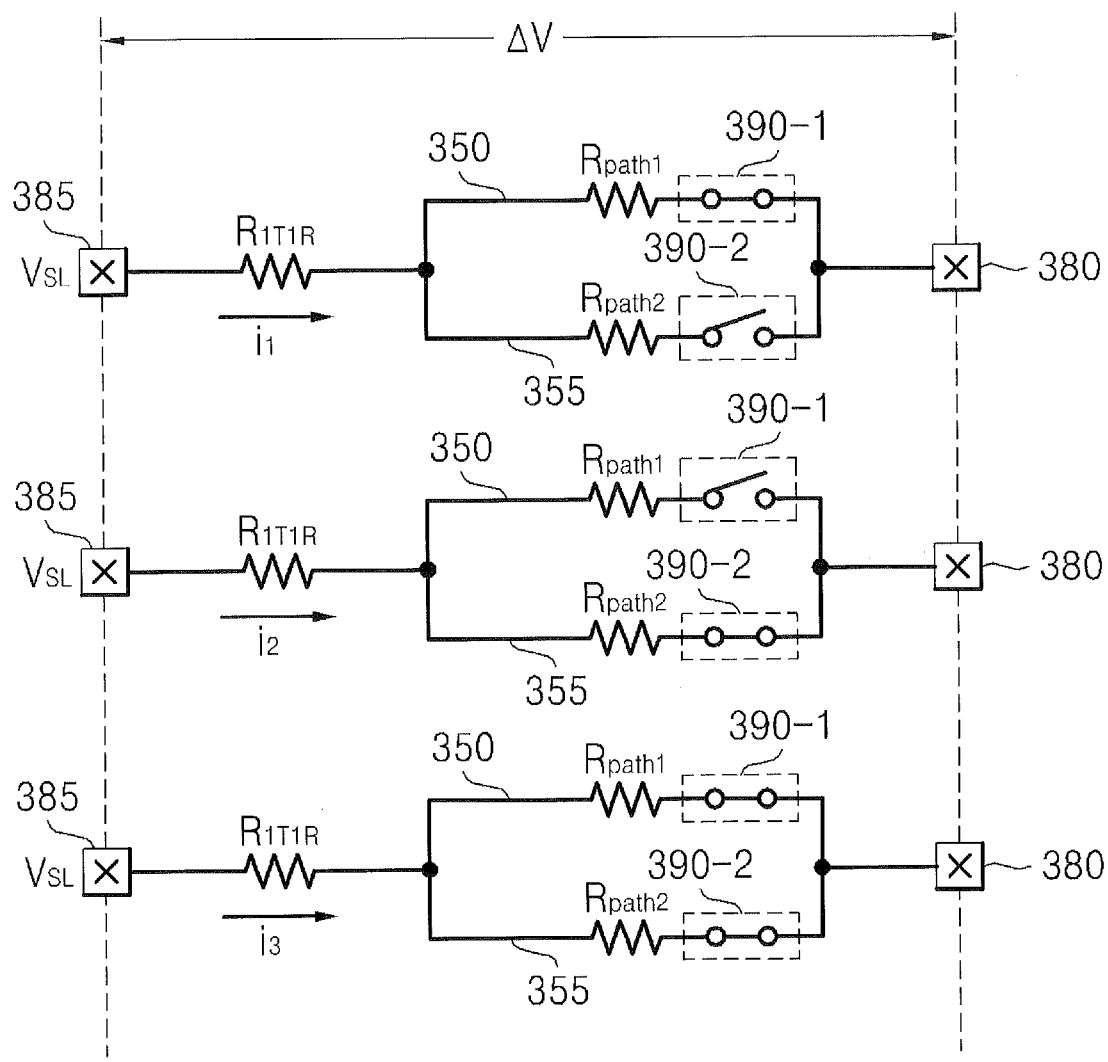
FIG. 5 is a schematic circuit diagram showing the connection of resistors included in a resistive memory device according to some embodiments of the inventive concept.

FIG. 4 is a table showing the relationships between resistance values with respect to the operations of a switch unit according to some embodiments of the inventive concept. FIG. 5 is a schematic circuit diagram showing the connection of resistors included in a resistive memory device according to some embodiments of the inventive concept.

Referring to FIGS. 1 through 5, a first path Path1 and/or a second path Path2 is formed according to the on/off operation of the first and second switching elements 390-1 and 390-2 included in the switch unit 390.

In detail, the first path Path1 is formed when the first switching element 390-1 is turned on. When the first path Path1 is formed, a voltage and a current are provided by the tester 30 to the dummy bit line 350 and a resistive memory cell MC.

Accordingly, when the first path Path1 is formed, the tester 30 may set the relation between a resistance value $R_{1T1R}$ of the resistive memory cell MC and a resistance value $R_{path1}$ of the dummy bit line 350. In detail, the tester 30 may set the relation between the resistance value $R_{1T1R}$ of the resistive memory cell MC and the resistance value $R_{path1}$ of the dummy bit line 350 based on a difference ΔV between voltages respectively applied to the connection pads 380 and 385 and a first current value $i_1$ that flows in the dummy bit line 350 and the resistive memory cell MC according to a voltage applied thereto. The relation may be defined as Equation 1:

$$\Delta V = (R_{1T1R} + R_{path1}) \times i_1 \qquad (1)$$

When the first switching element 390-1 is turned off and the second switching element 390-2 is turned on, the second path Path2 is formed.

In detail, when the second path Path2 is formed, a voltage and a current are provided by the tester 30 to the conducting wire 355 and the resistive memory cell MC.

Accordingly, when the second path Path2 is formed, the tester 30 may set the relation between the resistance value $R_{1T1R}$ of the resistive memory cell MC and a resistance value $R_{path2}$ of the conducting wire 355. In detail, the tester 30 may set the relation between the resistance value $R_{1T1R}$ of the resistive memory cell MC and the resistance value $R_{path2}$ of the conducting wire 355 based on the difference ΔV between the voltages respectively applied to the connection pads 380 and 385 and a second current value $i_2$ which flows in the conducting wire 355 and the resistive memory cell MC according to a voltage applied thereto. The relation may be defined as Equation 2:

$$\Delta V = (R_{1T1R} + R_{path2}) \times i_2. \qquad (2)$$

When the first and second switching elements 390-1 and 390-2 are both turned on, the first and second paths Path1 and Path2 are simultaneously formed.

When both the first and second paths Path1 and Path2 are formed, a voltage and a current are provided by the tester 30 to the dummy bit line 350, the conducting wire 355 and the resistive memory cell MC.

Accordingly, when the first and second paths Path1 and Path2 are formed, the tester 30 may set the relation among the resistance value $R_{1T1R}$ of the resistive memory cell MC, the resistance value $R_{path1}$ of the dummy bit line 350 and the resistance value $R_{path2}$ of the conducting wire 355. In detail, the tester 30 may set the relation among the resistance value $R_{1T1R}$ of the resistive memory cell MC, the resistance value $R_{path1}$ of the dummy bit line 350 and the resistance value $R_{path2}$ of the conducting wire 355 based on the difference ΔV between the voltages respectively applied to the connection pads 380 and 385 and a third current value $i_3$ which flows in the dummy bit line 350, the conducting wire 355 and the resistive memory cell MC according to a voltage applied thereto. The relation may be defined as Equation 3:

$$\Delta V = (R_{1T1R} + (R_{path1} \times R_{path2})/(R_{path1} + R_{path2})) \times i_3. \qquad (3)$$

The tester 30 may calculate the resistance value $R_{1T1R}$ of the resistive memory cell MC, the resistance value $R_{path1}$ of the dummy bit line 350 and the resistance value $R_{path2}$ of the conducting wire 355 using Equations 1, 2 and 3.

Figure 6:
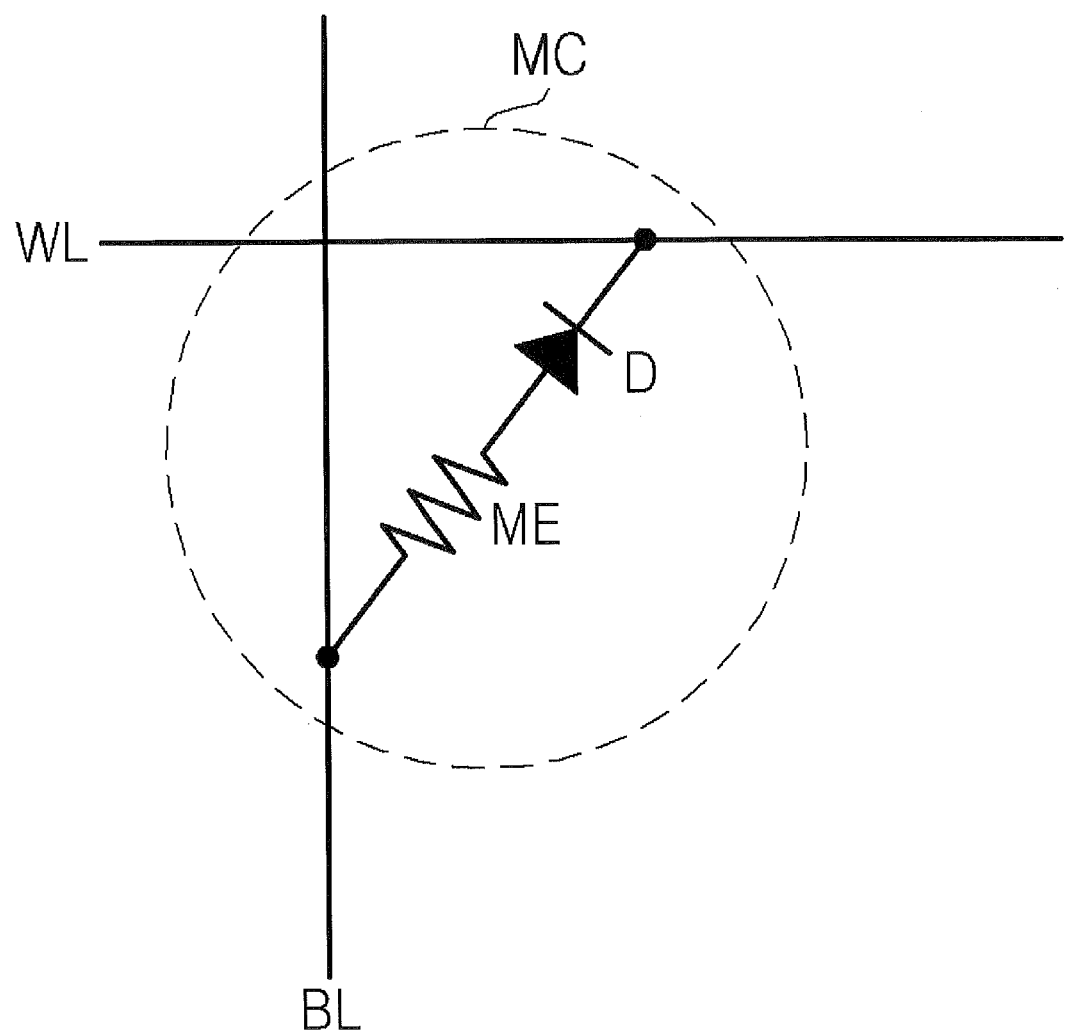
FIG. 6 is a diagram of a resistive memory cell illustrated in FIG. 1 according to some embodiments of the inventive concept.

FIG. 6 is a diagram of a resistive memory cell MC illustrated in FIG. 1 according to some embodiments of the inventive concept.

Referring to FIGS. 1 and 6, the resistive memory cell MC includes a memory element ME and a select element D connected in series between a bit line BL and a word line WL. A phase-change material is used as the memory element ME and a diode is used as the select element D. In other words, an anode of the diode D is connected to the memory element ME and a cathode thereof is connected to the word line WL.

When a voltage difference between the anode and the cathode of the diode D is higher than a threshold voltage of the diode D, the memory element ME of the resistive memory cell MC may be provided with a program current, e.g., the set current or the reset current, through the bit line BL.

Figure 7:
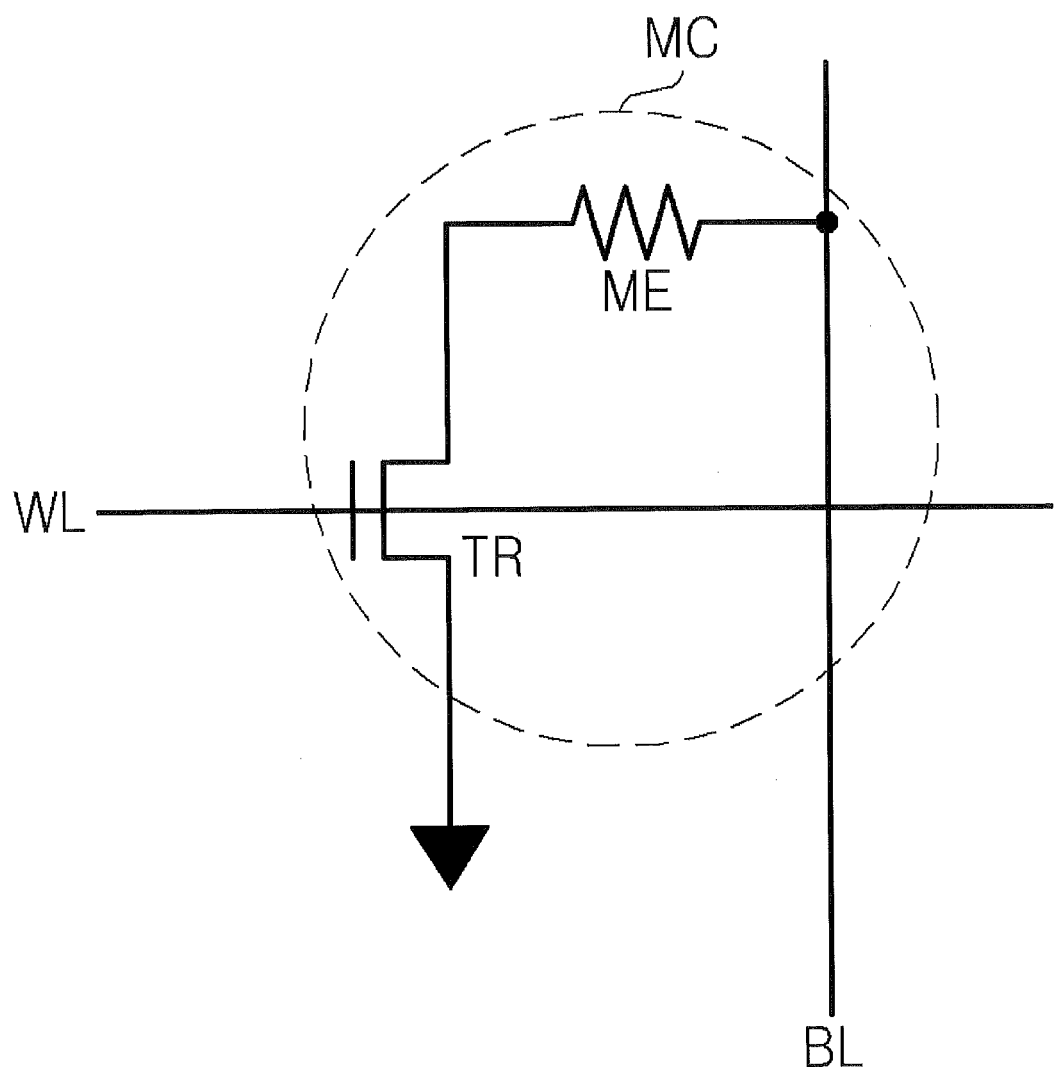
FIG. 7 is a diagram of a resistive memory cell illustrated in FIG. 1 according to other embodiments of the inventive concept.

FIG. 7 is a diagram of a resistive memory cell MC illustrated in FIG. 1 according to other embodiments of the inventive concept.

Referring to FIGS. 1 and 7, the resistive memory cell MC includes a memory element ME and a select element TR connected in series between a bit line BL and a power line (e.g., a ground line providing a ground voltage or a power line providing a predetermined voltage). A phase-change material is used as the memory element ME and a transistor is used as the select element TR.

When a voltage applied to a word line WL is higher than a threshold voltage of the transistor TR, the memory element ME of the resistive memory cell MC may be provided with a program current, e.g., the set current or the reset current, through the bit line BL.

In some embodiments of the inventive concept, the power line in the resistive memory device 10 may be a common source line (CSL). The tester 30 may apply a predetermined voltage to the CSL through the connection pad 385.

Figure 8:
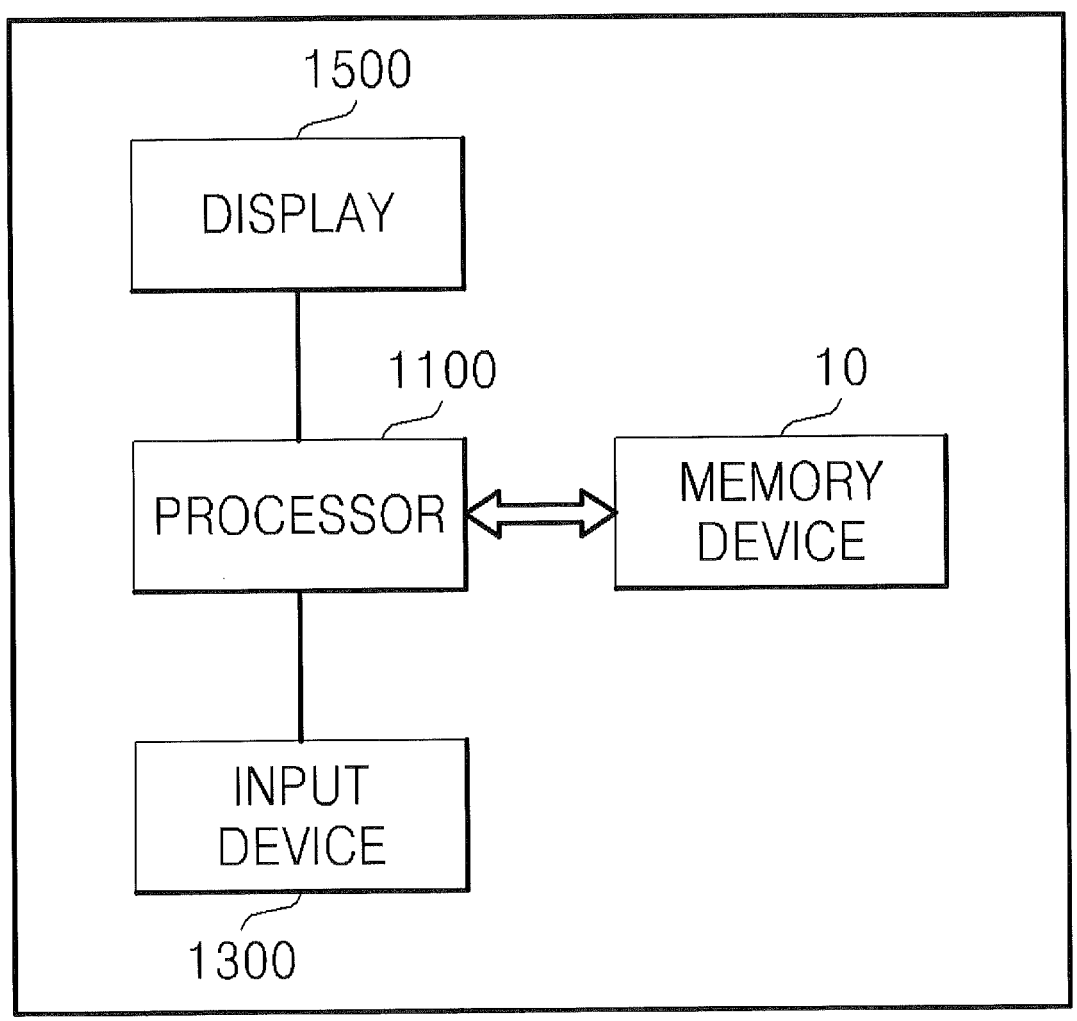
FIG. 8 is a block diagram of a memory system including the resistive memory device illustrated in FIG. 1 according to some embodiments of the inventive concept.

FIG. 8 is a block diagram of a memory system including the resistive memory device 10 illustrated in FIG. 1 according to some embodiments of the inventive concept. The memory system 1000 may be implemented as a data processing apparatus such as a tablet PC, a net-book, an e-reader, a personal digital assistant (PDA), a portable multimedia player (PMP), an MP3 player, a mobile phone, a smart phone, a wireless interne device and/or an MP4 player, among others.

The memory system 1000 includes the resistive memory device 10 for storing program bits and a processor 1100 controlling the data processing operations of the resistive memory device 10. The processor 1100 may display data stored in the resistive memory device 10 through a display 1500 according to data input through an input device 1300. The input device 1300 may be implemented by a pointing device such as a touch pad, a computer mouse, a keypad, and/or a keyboard, among others.

Figure 9:
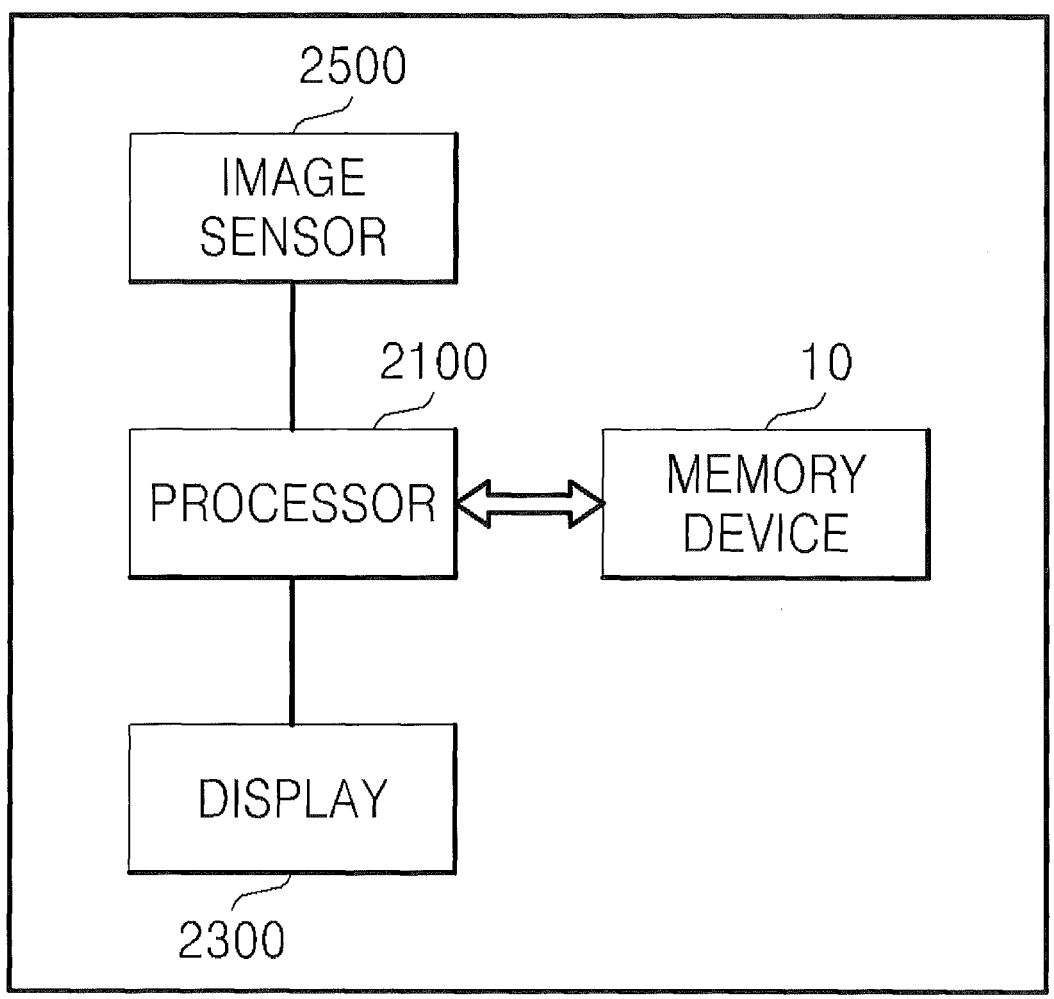
FIG. 9 is a block diagram of a memory system including the resistive memory device illustrated in FIG. 1 according to other embodiments of the inventive concept.

FIG. 9 is a block diagram of a memory system including the resistive memory device 10 illustrated in FIG. 1 according to other embodiments of the inventive concept. The memory system 2000 may be implemented as a digital camera, a mobile phone equipped with a digital camera, a smart phone equipped with a digital camera, or a tablet PC equipped with a digital camera.

The memory system 2000 includes the resistive memory device 10 for storing program bits and a processor 2100 controlling the data processing operations of the resistive memory device 10. An image sensor 2500 included in the memory system 2000 converts optical images into digital signals. The digital signals may be controlled by the processor 2100 to be displayed through a display 2300 or stored in the resistive memory device 10. Furthermore, the digital signals stored in the resistive memory device 10 may be controlled by the processor 2100 to be displayed through the display 2300.

Figure 10:
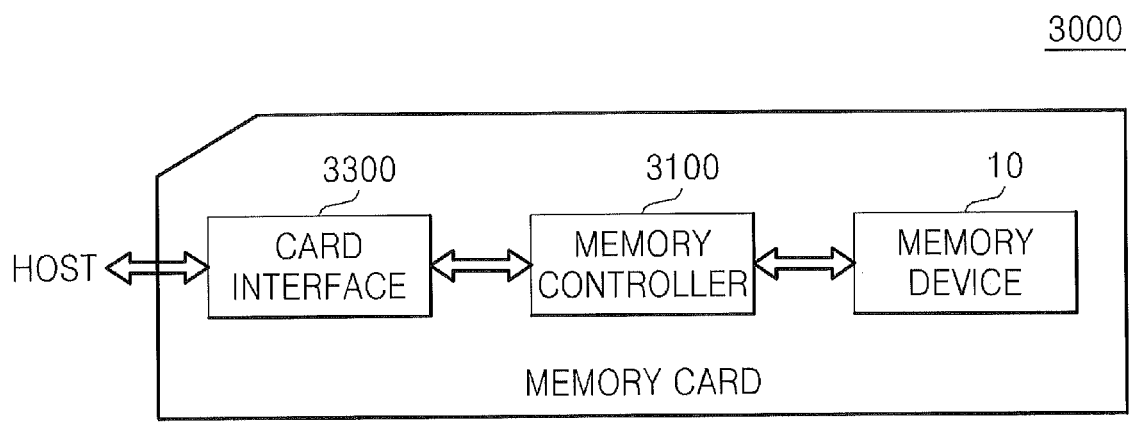
FIG. 10 is a block diagram of a memory system including the resistive memory device illustrated in FIG. 1 according to further embodiments of the inventive concept.

FIG. 10 is a block diagram of a memory system including the resistive memory device 10 illustrated in FIG. 1 according to further embodiments of the inventive concept. Referring to FIGS. 1 and 10, The memory system 3000 may be implemented as a memory card or a smart card, among others. The memory system 3000 includes the resistive memory device 10, a memory controller 3100, and a card interface 3300.

The memory controller 3100 may control data exchange between the resistive memory device 10 and the card interface 3300. The card interface 3300 may be a secure digital (SD) card interface or a multi-media card (MMC) interface, but the inventive concept is not limited to the current embodiments. The card interface 3300 may interface a host and the memory controller 3100 for data exchange according to a protocol of the host.

When the memory system 3000 is connected with the host such as a PC, a digital camera, a digital audio player, a cellular phone, a console video game hardware, or a digital set-top box, the host may perform data communication with the resistive memory device 10 through the card interface 3300 and the memory controller 3100.

Figure 11:
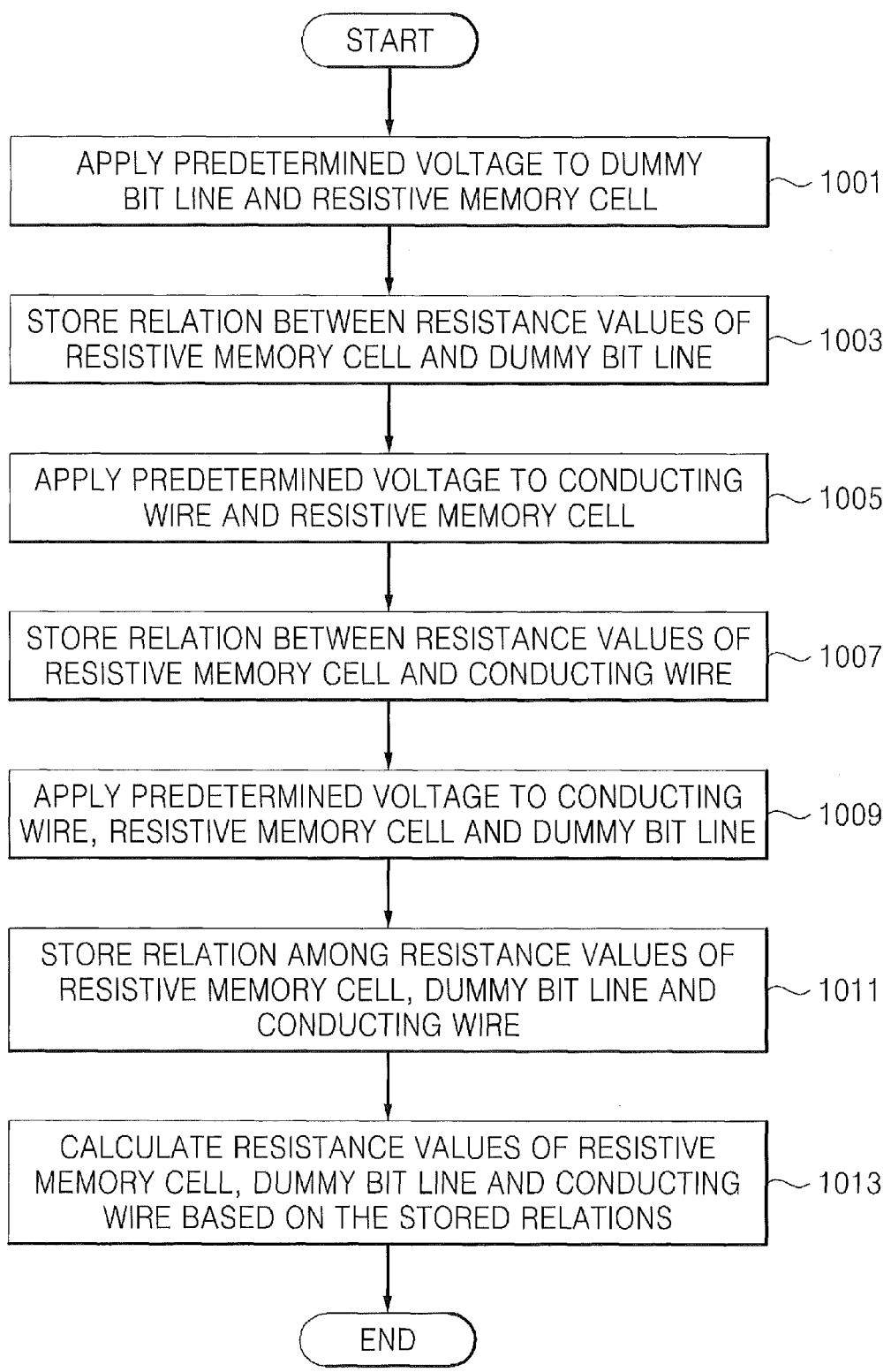
FIG. 11 is a flowchart illustrating operations in methods of testing a resistive memory device according to some embodiments of the inventive concept.

FIG. 11 is a flowchart of a method of testing the resistive memory device 10 according to some embodiments of the inventive concept. Referring to FIGS. 1 through 5 and FIG. 11, the tester 30 applies a predetermined voltage to the at least one dummy bit line 350 among the bit lines $BL_1$ through $BL_m$ and to a selected resistive memory cell MC (block 1001). The tester 30 exists outside the resistive memory device 10 which includes resistive memory cells connected to the dummy bit line 350. Accordingly, the predetermined voltage is externally applied to the resistive memory device 10.

The tester 30 sets a relation between a resistance value of the resistive memory cell MC and a resistance value of the dummy bit line 350 (block 1003). The relation between the resistance value of the resistive memory cell MC and the resistance value of the dummy bit line 350 is set based on a first current value $i_1$, which flows in the dummy bit line 350 and the resistive memory cell MC according to a voltage applied to the dummy bit line 350 and the resistive memory cell MC, and a voltage applied to the resistive memory device 10 or a difference between voltages applied thereto.

The tester 30 applies the predetermined voltage to the conducting wire 355 connected to the dummy bit line 350 and the resistive memory cell MC (block 1005). The tester 30 sets a relation between the resistance value of the resistive memory cell MC and a resistance value of the conducting wire 355 (block 1007). The relation between the resistance value of the resistive memory cell MC and the resistance value of the conducting wire 355 is set based on a second current value $i_2$, which flows in the conducting wire 355 and the resistive memory cell MC according to a voltage applied to the conducting wire 355 and the resistive memory cell MC, and a voltage applied to the resistive memory device 10 or a difference between voltages applied thereto.

The tester 30 applies the predetermined voltage to the dummy bit line 350, the conducting wire 355 and the resistive memory cell MC (block 1009). The tester 30 sets a relation among resistance values of the resistive memory cell MC, the dummy bit line 350 and the conducting wire 355 (block 1011). The relation among the resistance values of the resistive memory cell MC, the dummy bit line 350 and the conducting wire 355 is set based on a third current value $i_3$, which flows in the dummy bit line 350, the conducting wire 355 and the resistive memory cell MC according to a voltage applied to the dummy bit line 350, the conducting wire 355 and the resistive memory cell MC, and a voltage applied to the resistive memory device 10 or a difference between voltages applied thereto.

The relation between the resistance values of the resistive memory cell MC and the dummy bit line 350 may be defined as $\Delta V = (R_{1T1R} + R_{path1}) \times i_1$, the relation between the resistance values of the resistive memory cell MC and the conducting wire 355 may be defined as $\Delta V = (R_{1T1R} + R_{path2}) \times i_2$, and the relation among the resistance values of the resistive memory cell MC, the dummy bit line 350 and the conducting wire 355 may be defined as $\Delta V = (R_{1T1R} + (R_{path1} \times R_{path2})/(R_{path1} + R_{path2})) \times i_3$, where $\Delta V$, $i_1$, $i_2$ and $i_3$ denote a voltage difference between the connection pads 380 and 385, the first current value, the second current value and the third current value, respectively, $R_{1T1R}$ denotes the resistance value of the resistive memory cell MC, $R_{path1}$ denotes the resistance value of the dummy bit line 350, and $R_{path2}$ denotes the resistance value of the conducting wire 355.

In other words, the values that are wanted to obtain are the resistance value $R_{1T1R}$ of the resistive memory cell MC, the resistance value $R_{path1}$ of the dummy bit line 350 of and the resistance value $R_{path2}$ the conducting wire 355. Since the number of unknown quantities is three and the number of equations about them is also three, the resistance values of the resistive memory cell MC, the dummy bit line 350 and the conducting wire 355 can be obtained (block 1013).

Operations as disclosed above may be embodied in an order that is different from what is displayed and/or described. For instance, it does not matter which operation among setting the relation between the resistance values of the resistive memory cell MC and the dummy bit line 350, setting the relation between the resistance values of the resistive memory cell MC and the conducting wire 355 and setting the relation among the resistance values of the resistive memory cell MC, the dummy bit line 350 and the conducting wire 355 is performed before another.

The resistive memory device according to some embodiments of the inventive concept may be packed in various types of packages. For example, the various packages may include PoP(Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), and/or Wafer-Level Processed Stack Package(WSP), among others.

According to some embodiments of the inventive concept, a dummy bit line which does not directly store data may be provided and a resistance of a bit line may be directly calculated using the dummy bit line to carry out a timing test of a sense amplifier or a write driver or trimming of a DC level.

In other words, an actual resistance value of the bit line is calculated, and therefore, the amount of current needed to be supplied to a memory cell is detected. In addition, the number of memory cells per bit line is adjusted so that the degree of integration of memory cells can be increased and the memory cells operate efficiently in a resistive memory device.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the embodiments disclosed herein, and that modifications to the disclosed embodiments, as well as other embodiments, are intended to be included within the scope of the appended claims. The present inventive concept is defined by the following claims.

What is claimed is:

1. A memory device, the device comprising:
    a memory cell array that includes a plurality of resistive memory cells;
    a plurality of bit lines connected to the plurality of resistive memory cells, the plurality of bit lines including at least one dummy bit line;
    a conductive wire that is connected to the at least one dummy bit line; and
    a switch unit comprising a first switching element that is configured to connect the dummy bit line to an external device that is outside the memory device.

2. The device according to claim 1, wherein the switch unit further comprises a second switching element that is configured to connect the conducting wire to the external device.

3. The device according to claim 2, further comprising control logic that is configured to control an on/off operation of at least one of the first switching element and the second switching element.

4. The device according to claim 3, wherein the control logic controls the first switching element to connect the external device with the dummy bit line and controls the second switching element to connect the external device with the conducting wire.

5. The device according to claim 1, wherein ones of the resistive memory cells include a memory element and at least one of a diode or a select element.

6. A test system comprising:
    the memory device of claim 3;
    a connection pad configured to connect the memory device with the external device; and
    a tester configured to adjust current flowing in each of the resistive memory cells, the dummy bit line and the conducting wire and adjust voltage applied to each resistive memory cell, the dummy bit line and the conducting wire through the connection pad.

7. The test system according to claim 6, wherein the tester controls the control logic to turn on the first switching element and obtains a relation between a resistance value of ones of the resistive memory cells and a resistance value of the dummy bit line when the first switching element is turned on.

8. The test system according to claim 6, wherein the tester controls the control logic to turn on the second switching element and obtains a relation between a resistance value of ones of the resistive memory cells and a resistance value of the conducting wire when the second switching element is turned on.

9. The test system according to claim 6, wherein the tester controls the control logic to turn on the first and second switching elements and obtains a relation among a resistance value of ones of the resistive memory cells, a resistance value of the dummy bit line and a resistance value of the conducting wire when the first and second switching element are turned on.

10. The test system according to claim 9, wherein the tester calculates the resistance values of the dummy bit line, the conducting wire and the resistive memory cell based on a current flowing in ones of the resistive memory cells, the dummy bit line and the conducting wire according to the applied voltage.

11. A resistive memory system comprising:
    the memory device of claim 2; and
    a processor configured to control an operation of the memory device.

12. A method of testing a resistive memory device, the method comprising:
    applying a predetermined voltage to at least one dummy bit line among a plurality of bit lines and a resistive memory cell;
    storing a relation between a resistance value of the resistive memory cell and a resistance value of the dummy bit line;
    applying the predetermined voltage to a conducting wire connected to the dummy bit line and the resistive memory cell;
    storing a relation between the resistance value of the resistive memory cell and a resistance value of the conducting wire;
    applying the predetermined voltage to the dummy bit line, the conducting wire and the resistive memory cell;
    storing a relation among the resistance values of the dummy bit line, the conducting wire and the resistive memory cell; and
    calculating the resistance values of the resistive memory cell, the dummy bit line and the conducting wire based on the stored relations.

13. The method according to claim 12, wherein the predetermined voltage is applied by an external device outside the resistive memory device that includes the dummy bit line and the resistive memory cell connected to the dummy bit line.

14. The method according to claim 12, wherein storing the relation between the resistance value of the resistive memory cell and the resistance value of the dummy bit line comprises storing the relation determined based on a first current value that flows in the dummy bit line and the resistive memory cell according to the predetermined voltage and the predetermined voltage.

15. The method according to claim 12, wherein storing the relation between the resistance value of the resistive memory cell and the resistance value of the conducting wire comprises storing the relation determined based on a second current value which flows in the conducting wire and the resistive memory cell according to the predetermined voltage and the predetermined voltage.

16. The method according to claim 12, wherein storing the relation among the resistance values of the dummy bit line, the conducting wire and the resistive memory cell comprises storing the relation determined based on a third current value which flows in the dummy bit line, the conducting wire and the resistive memory cell according to the predetermined voltage and the predetermined voltage.

17. The method according to claim 12, wherein the relation between the resistance value of the resistive memory cell and the resistance value of the dummy bit line is $\Delta V=(R_{1T1R}+R_{path1})\times i_1$, the relation between the resistance values of the resistive memory cell and the conducting wire is $\Delta V=(R_{1T1R}+R_{path2})\times i_2$, and the relation among the resistance values of the resistive memory cell, the conducting wire and the dummy bit line is $\Delta V=(R_{1T1R}+(R_{path1}\times R_{path2})/(R_{path1}+R_{path2}))\times i_3$, where $\Delta V$, $i_1$, $i_2$ and $i_3$ respectively denote the predetermined voltage, the first current value, the second current value and the third current value, $R_{1T1R}$ denotes the resistance value of the resistive memory cell, $R_{path1}$ denotes the resistance value of the dummy bit line, and $R_{path2}$ denotes the resistance value of the conducting wire.

* * * * *